United States Patent [19]  
Harada et al.

[11] Patent Number: 4,633,439  
[45] Date of Patent: Dec. 30, 1986

[54] SUPERCONDUCTING READ-ONLY MEMORIES OR PROGRAMABLE LOGIC ARRAYS HAVING THE SAME

[75] Inventors: Yutaka Harada, Kodaira; Toshikazu Nishino, Kawasaki, both of Japan

[73] Assignee: Hitachi, Ltd., Tokyo, Japan

[21] Appl. No.: 515,514

[22] Filed: Jul. 20, 1983

[30] Foreign Application Priority Data

Jul. 21, 1982 [JP] Japan ................................ 57-125697  
Jul. 21, 1982 [JP] Japan ................................ 57-125698  
Jul. 23, 1982 [JP] Japan ........................... 57-111002[U]  
Jul. 23, 1982 [JP] Japan ........................... 57-111003[U]

[51] Int. Cl.$^4$ ...................... G11C 11/44; G11C 17/02; H03K 19/95  
[52] U.S. Cl. ................................... 365/162; 307/462; 307/465; 365/104  
[58] Field of Search ....................... 365/162, 189, 104; 357/5; 307/306, 245, 277, 462, 476, 465

[56] References Cited

U.S. PATENT DOCUMENTS 3,626,391 7/1968 Anacker .................................. 357/5  
4,151,605 4/1979 Faris ..................................... 307/306  
4,360,898 11/1982 Faris ..................................... 365/162

OTHER PUBLICATIONS

Hamel et al, "High Density Read Only Josephson Device Memory Cell Employing a Single Device", IBM Technical Disclosure Bulletin, vol. 17, No. 11, Apr. 1975, pp. 3349-3350.  
Braslau et al, "Josephson Read Only Memory", IBM Technical Disclosure Bulletin, vol 24, No. 1A, Jun. 1981, pp. 277-278.  
Broom et al, "Josephson Memory Cell with Magnetic Film", IBM Technical Disclosure Bulletin, vol. 20, No. 7, Dec. 1977, pp. 2839-2840.  
Faris et al, "Basic Design of a Josephson Technology Cache Memory", IBM Jour. of Res. Devel., vol. 24, No. 2, Mar. 1980, pp. 143-154.  
Terlep, "Personalization Approach for Josephson Array Logic Memory Cells", IBM Technical Disclosure Bulletin, vol. 17, No. 7, Dec. 1974, pp. 2059-2060.  
Matisoo, "Overview of Josephson Technology Logic and Memory", IBM Journal of Research Development, vol. 24, No. 2, Mar. 1980, pp. 113-129.

Primary Examiner—James W. Moffitt  
Assistant Examiner—Glenn Gossage  
Attorney, Agent, or Firm—Antonelli, Terry & Wands

[57] ABSTRACT

An A.C. powered type logic array of very high speed operations which employs Josephson devices and which can program any desired logic. The logic array comprises a first logic array which delivers AND logic signals of desired ones of input signals, and a second logic array which delivers OR logic signals of desired ones of the AND outputs. Each of the first and second logic arrays comprises a plurality of bit lines which connect a plurality of arrayed Josephson devices in series at respective rows and each of which has one end connected to a power source and the other end grounded through a resistor, and word lines which are arranged in the column direction of the Josephson device array and which are selectively coupled to the Josephson devices. Whether or not the word lines are coupled to the respective Josephson devices of the arrays, is determined by the patterns of the word lines or the patterns of the Josephson devices, thereby to program the desired logic.

8 Claims, 31 Drawing Figures

SUPERCONDUCTING READ-ONLY MEMORIES OR PROGRAMABLE LOGIC ARRAYS HAVING THE SAME

BACKGROUND OF THE INVENTION

The present invention relates to a programmable logic array employing superconducting devices, especially Josephson devices, and also to read-only memories for use in the logic array.

Since a Josephson device is switched at high speed and dissipates low power, it has a significant potential for application to digital systems such as computer. A prir art arrangement has taken an expedient wherein a Josephson LSI having a complicated logic is constructed by combining individual AND circuits and OR circuits. This method, however, has the disadvantage that logic amendments due to a design alteration and an erroneous design cannot be coped with quickly. Particularly a system employing Josephson devices operates under only the environment of extremely low temperature (about 4° K.), exhibits as small a signal amplitude voltage as 2.5 mV and affords fast circuit operations on the order of several ps. It is accordingly difficult to follow up logic operations with a probe or the like. Therefore, it is impossible to repeat a large number of small amendments, and the logic amendments must be met by performing a small number of large amendments on the scale of the whole LSI. Consequently, the system employing the Josephson devices needs to quickly perform the amendments on the scale of the whole LSI, but this is equivalent to re-designing the LSI. The LSI in the prior art, in which the logic is organized by the combination of the AND circuits and OR circuits, requires a high design cost and a long design time. Therefore, it has the disadvantages that it is expensive and that a long time is required for finishing a system.

U.S. Pat. No. 4,360,898 discloses a programable logic array comprising in combination two logic arrays in each of which Josephson devices are disposed at selected ones of the intersection points between a plurality of superconducting loops and a plurality of superconducting wiring leads or loops in a direction in which they intersect the superconducting loops. The known programable logic array is driven by D.C. power source means. Therefore, after the operations of each cycle have been performed, the Josephson devices for coupling input signals need to be reset by any method. Another disadvantage is that, since direct currents flow to the loops in succession, the access speed is low.

SUMMARY OF THE INVENTION

An object of the present invention is to provide a fast A.C. powered programable logic array in which logic amendments can be easily made, whereby the period of time for system design and the expenses thereof can be reduced.

Another object of the present invention is to provide a programable logic array which can realize an enhanced density of integration.

Still another object of the present invention is to provide a programable logic array which can equalize the inductances and capacitances of a plurality of bit lines constituting the logic array, whereby stable outputs can be delivered from the respective bit lines.

One characterizing construction of the present invention resides in a superconducting memory type logic array comprising a first logic array including first Josephson devices which are arranged in the form of an array, first bit lines which connect respective rows of said first Josephson devices in series and each of which has one end connected to a power source and the other end grounded through a resistor, and first word lines which are arranged in respective columns of said first Josephson devices and which selectively couple input signals to the individual Josephson devices; a second logic array including second Josephson devices which are arranged in the form of an array, second bit lines which connect respective rows of said second Josephson devices in series and each of which has one end connected to a power source and the other end grounded through a resistor, and second word lines which are arranged in respective columns of said second Josephson devices and which selectively couple signals to the individual Josephson devices; a connection circuit for connecting AND outputs of the rows of said first logic array to said second word lines respectively; and an output circuit for deriving OR outputs of the respective rows of said second logic array.

According to such construction, currents flow through the bits of the logic arrays, to produce logic outputs, so that high-speed read-out is executed. It is therefore permitted to assemble an A.C.-driven ultrahigh-speed logic system.

DESCRIPTION OF THE PREFERRED EMBODIMENTS

Figure 1:
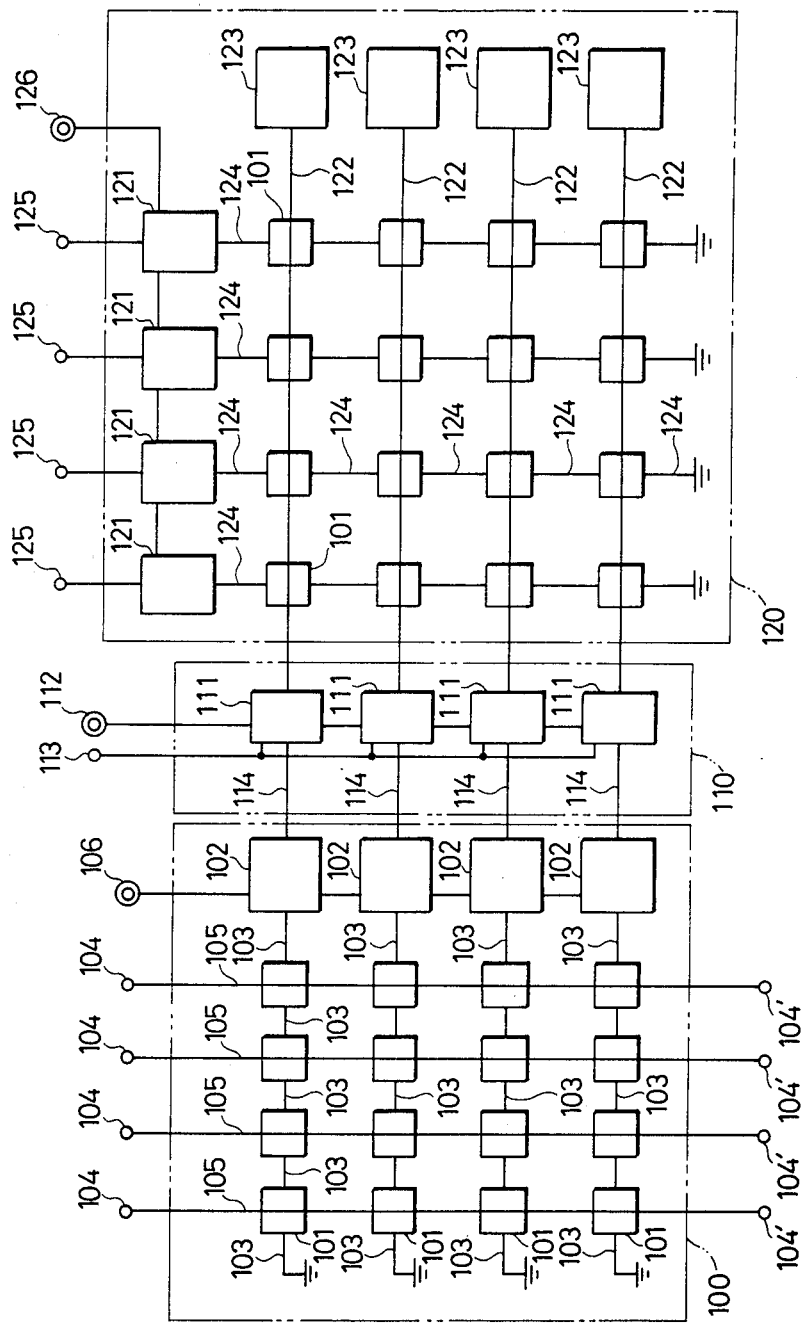
FIG. 1 is a block diagram showing the general arrangement of a first embodiment of the present invention.

Referring to FIG. 1, the general arrangement of a programable memory type logic array embodying the present invention will be described. The programable memory type logic array (hereinbelow, termed "logic array") is composed of a first logic array 100, a second logic array 120 and timed inverter circuits 110. In the first logic array 100, a plurality of memory type logic cells (hereinbelow, termed "logic cells") 101 are arranged flush in the vertical direction and lateral direction. The arrayed logic cells 101 have first word lines 105 arranged which are common in the vertical direction. Magnetic fluxes generated by word currents, which flow through the first word lines 105 via terminals 104 and 104′, interlink with the corresponding logic cells 101. The arrayed logic cells 101 are connected by first bit lines 103 in the lateral direction. One end of each of the first bit lines 103 is grounded, while the other end is connected to a first bit driver circuit 102. The first bit driver circuits 102 are supplied with electric power through a terminal 106. The outputs of the first bit driver circuits 102 are respectively connected to the corresponding timed inverter circuits 111 of the timed inverter circuit group 110 through wiring leads 114. The timed inverter circuits 111 are supplied with electric power through a terminal 112. In addition, the timed inverter circuits 111 are supplied with a trigger pulse from a trigger terminal 113, and at the timing thereof, pulse signals are fed from the respective timed inverter circuits 111 to the second logic array. The second logic array 120 has a plurality of logic cells 101 arranged flush in the vertical direction and lateral direction. The logic cells 101 arrayed in the second logic array 120 have second word lines 122 arranged which are common in the lateral direction. One end of each of the second word lines 122 is connected to the corresponding timed inverter circuit 111, while the other end is connected to a corresponding terminating circuit 123. Magnetic fluxes generated by currents, which flow through the second word lines 122 from the respective timed inverter circuits 111, interlink with the logic cells 101 coupled with the second word lines 122. The logic cells 101 arrayed in the second logic array 120 are connected by second bit lines 124 in the vertical direction. One end of each of the second bit lines 124 is connected to a corresponding second bit driver circuit 121, while the terminal end thereof is grounded. The respective second bit driver circuits 121 are supplied with electric power from a terminal 126.

Figure 2:
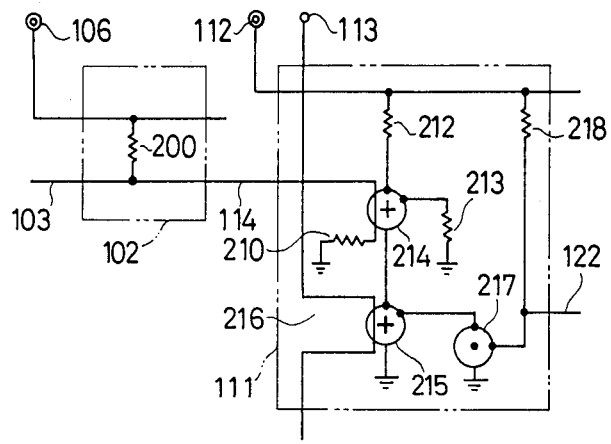
FIG. 2 shows circuit diagrams of blocks 102 and 111 in FIG. 1.

FIG. 2 shows examples of the first bit driver circuit 102 and the timed inverter circuit 111. The first bit driver circuit 102 is constructed of a resistor 200 one end of which is connected to the terminal 106 and the other end of which is connected to the first bit line 103 and the wiring 114. This timed inverter circuit 111 is described in detail in, for example, IBM Journal of research and development, Vol. 24, No. 2, March 1980, pp. 113–129. It is constructed of a first magnetic coupling Josephson OR circuit (Josephson Interference Device) 214, a second magnetic coupling Josephson OR circuit 215, a current injection type Josephson AND circuit 217 (Current Injection Device), a first resistor 212, a second resistor 218 and a third resistor 213. The wiring 114 passes near the first magnetic coupling Josephson OR circuit 214, and is terminated through a resistor 210. A magnetic flux generated by current, which flows out through the wiring 114 from the first bit circuit 102, interlinks with the first magnetic coupling Josephson OR circuit 214. A wiring lead 216 is arranged near the second magnetic coupling Josephson OR circuit 215, and a magnetic flux generated by current, which is supplied to the wiring 216 from the terminal 113, interlinks with the second magnetic coupling Josephson OR circuit. The output of the current injection type Josephson AND circuit 217 is connected to the second word line 122.

Figure 3:
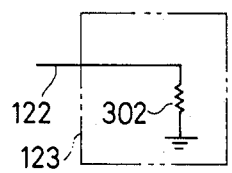
FIG. 3 is a circuit diagram of a block 123 in FIG. 1.

FIG. 3 shows an example of the terminating circuit 123. The terminating circuit is constructed of a resistor 302 one end of which is connected to the second word line 122 and the other end of which is grounded.

Figure 4:
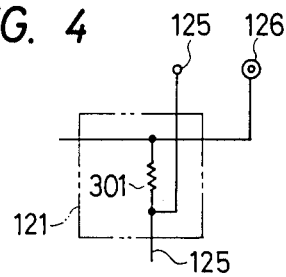
FIG. 4 is a circuit diagram of a block 121 in FIG. 1.

FIG. 4 shows an example of the second bit driver circuit 121. This second bit driver circuit 121 is constructed of a resistor 301 one end of which is connected to the terminal 126 and the other end of which is connected to an output terminal 125 as well as the second bit line 124.

Figure 5A:
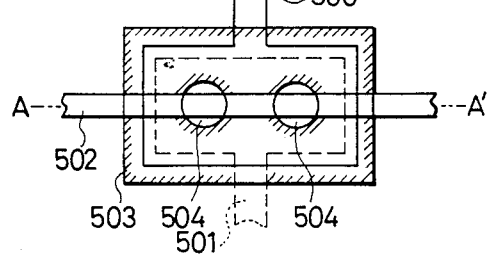
FIGS. 5a and 5b and FIGS. 6a and 6b show plan views and sectional views of elements in a block 101 in FIG. 1, respectively.
Figure 6A:
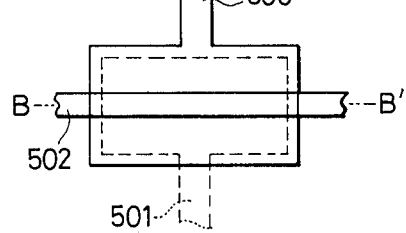
Figures 5B, 6B:
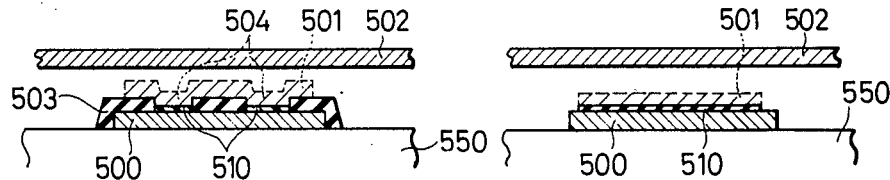

FIGS. 5a and 5b and FIGS. 6a and 6b show the structures of the logic cells 101 for use in the first logic array 100 and second logic array 120 shown in FIG. 1. FIG. 5a is a plan view of the logic cell in a programed state, while FIG. 5b is a sectional view thereof taken along line A—A′. FIG. 6a is a plan view of the logic cell in an unprogramed state, while FIG. 6b is a sectional view thereof taken along line A—A′.

The logic cell shown in FIGS. 6a and 6b is such that a base electrode 500 and a counter electrode 501 are opposed through an insulator layer 510 which is as thin as several nm. A part where the base electrode 500 and the counter electrode 501 confront each other through the thin insulator layer is a Josephson junction 504. A control wiring lead 502 is arranged over the base electrode 500 and the counter electrode 501. These portions are stacked and formed on a substrate 550 which includes a ground plane of a superconducting material and an insulator film covering it. The control wiring 502 corresponds to the first word line 105 in the first logic array 100, and to the second word line 122 in the second logic array 120. In the logic cell in the programed state shown in FIG. 5, a base electrode 500 and a counter electrode 501 are opposed through an insulator layer 503 which is as thick as several hundred nm, and recesses are provided in parts of the thick insulator layer 503, so that the electrodes confront each other in only the recessed parts through insulator layers 510 which are as thin as several nm. In this case, the recessed parts serve as Josephson junctions 504. In the logic cell shown in FIGS. 5a and 5b, the two Josephson junctions 504, base electrode 500 and counter electrode 501 constitute a superconducting loop, and the so-called Josephson interferometer of the two junctions is constructed.

Figure 7:
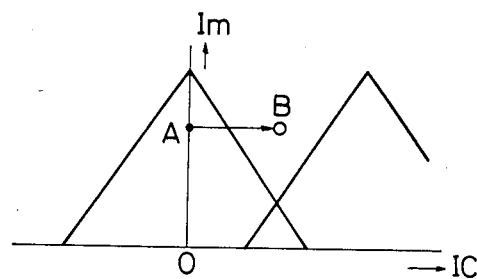
FIG. 7 is a characteristic diagram of the element shown in FIGS. 5a and 5b.

FIG. 7 illustrates the relationship between the maximum superconducting current $I_m$ which can flow through the logic cell shown in FIGS. 5a and 5b, and a control current $I_c$ which flows through a control wiring lead 502. Since the logic cell shown in FIGS. 6a and 6b has a Josephson junction area larger than that of the logic cell shown in FIGS. 5a and 5b, the maximum superconducting current which can flow through the former logic cell is greater than in FIG. 7. The base electrode 500 and counter electrode 501 are connected to the first bit line 103 in the first logic array 100, and to the second bit line 124 in the second logic array 120.

Now, the operations of the programable logic array shown in FIG. 1 will be described. In the lateral direction (hereinbelow, termed "bit direction") of the first logic array 100, the plurality of memory cells 101 are connected in series through the first bit lines 103. In a case where current is flowing through none of the first word lines 105, all the logic cells 101 are in the superconducting state, and hence, currents fed through the terminal 106 and the resistors 200 flow to the ground through the serially-connected logic cells 101. The serially-connected logic cells 101 have the programed state illustrated in FIGS. 5a and 5b, and the unprogramed state illustrated in FIGS. 6a and 6b. Since, in the logic cell 101 in the unprogramed state shown in FIGS. 6a and 6b, the maximum superconducting current permitted to flow therethrough is great, this logic cell remains in the superconducting state even when the current is caused to flow through the first word line 105 located therein. As regards the logic cell 101 in the programed state shown in FIGS. 5a and 5b, the relationship between the current of the first word line 105 and the maximum superconducting current permitted to flow through this logic cell 101 is illustrated in FIG. 7. In a case where no current flows through the word line 105, the logic cell has an operating point A in FIG. 7 and is in the superconducting state. In contrast, when current flows through the word line 105, the operating point shifts to a point B in FIG. 7, the non-superconducting state is established and the current having been flowing through the logic cell 101 is cut off. Therefore, the current having been flowed to the serially-connected logic cells 101 through the first bit line 103 flows to the timed inverter circuit 111 through the wiring 114. The logic cells 101 are connected in series in the bit direction, and even when one of them has shifted into the non-superconducting state, the current flows to the timed inverter circuit 111. Accordingly, the serially-connected logic cells 101 and the first bit driver circuit 102 constitute an OR logic circuit for the signal of a wiring 114 and the signals of the first word lines 105 located in the logic cells 101 in the programed state. The timed inverter circuit 111 supplies the inverted signal of the signal of the wiring 114 to the second word line 122 of the second logic array 120 at a timing which is synchronized to a trigger signal applied from the trigger terminal 113. An OR logic signal formed by the first logic array 100 is inverted by the timed inverter circuit, and becomes an AND signal. Likewise to the first logic array 100, the second logic array 120 executes the OR logic operation for the signals of the second word lines 122 and delivers the resultant OR signals to the output signal terminals 125.

In the above embodiment, a desired logic can be programed by selectively programing the logic cells 101 which are arrayed in the logic arrays 100 and 120. That is, the desired AND signals of signals applied across the input terminals 104 and 104' are obtained in the logic array 100, and the desired OR signals of these output signals are obtained in the logic array 120, so that a desired logic signal with the OR logic and AND logic combined can be provided.

Figure 9:
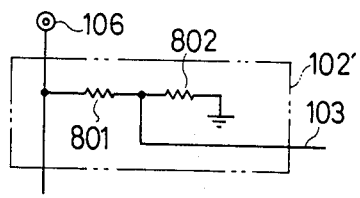
FIG. 9 is a circuit diagram of a block 102' in FIG. 8.
Figure 10:
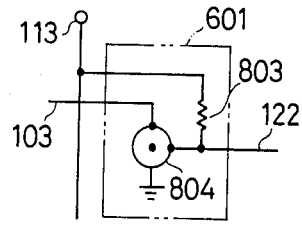
FIG. 10 is a circuit diagram of a block 601 in FIG. 8.
Figure 8:
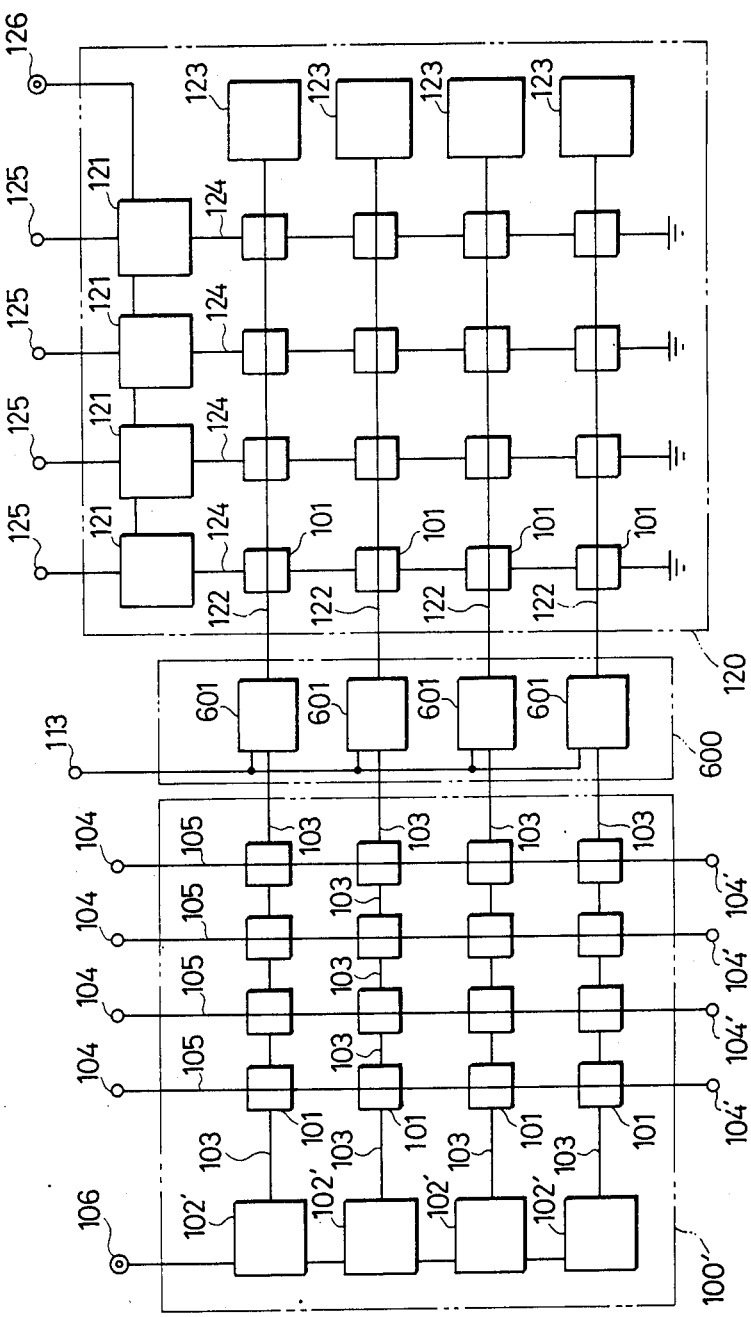
FIG. 8 is a block diagram showing the general arrangement of a second embodiment of the present invention.

FIG. 8 shows a second embodiment according to the present invention. The programable logic array shown in FIG. 8 is constructed of a first logic array 100', affirmative driver circuits 600 and a second logic array 120. The second logic array 120 in FIG. 8 has the same arrangement as that of the second logic array 120 shown in FIG. 1. The first logic array 100' in FIG. 8 is constructed of logic cells 101 arrayed flush, bit driver circuits 102', first word lines 105 and first bit lines 103. The affirmative driver circuit group 600 is constructed of a plurality of affirmative driver circuits 601. FIG. 9 shows an example of the bit driver circuit 102'. The bit driver circuit 102' has an arrangement wherein two resistors 801 and 802 are connected in series and wherein one end of the series connection is grounded, while the other end is connected to a terminal 106. The middle point of the serially-connected resistors is connected to the first bit line 103. FIG. 10 shows an example of the affirmative driver circuit 601. The affirmative driver circuit 601 is constructed of a current injection type Josephson AND circuit 804 and a resistor 803. The first bit line 103 is grounded through the current injection type Josephson AND circuit 804, the output of which is connected to the second word line 122. The current injection type Josephson AND circuit is described in detail in, for example, IBM Journal of research and development, Vol. 24, No. 2, March 1980, pp. 113-129.

Now, the operations of the programable logic array shown in FIG. 8 will be described. In a case where no current flows through the first word lines 105 of the first logic array 100', all the logic cells 101 are in the superconducting state, and hence, currents flowing through the terminal 106 and the resistors 801 flow through the logic cells via the first bit lines 103. When, even in one of the logic cells 101 connected in series in the bit direction and programed as illustrated in FIGS. 5a and 5b, current flows through the first word line 105, the current having been flowing through the logic cell is cut off, and the current having been flowing through the first bit line 103 flows to the ground through the resistor 802. It is to be understood that the current flowing through the first word line 105 and the current flowing through the first bit line 103 are subjected to the NOR logic operation, namely, AND logic operation. The signal of the first bit line 103 is applied to the second word line 122 by the current injection type AND circuit 804 in synchronism with a trigger signal which is applied from a trigger terminal 113. The operating principle that the OR logic operation is executed by the second logic array 120, is as explained with reference to FIG. 1. It is apparent from the foregoing that the programable logic array shown in FIG. 8 effects the same operations as those of the programable logic array shown in FIG. 1.

Figure 11A:
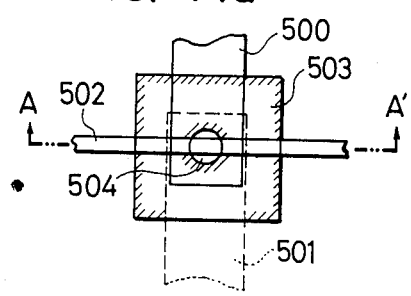
FIGS. 11a and 11b and FIGS. 12a and 12b show plan views and sectional views of different examples of elements in the block 101 of FIG. 1 or FIG. 8, respectively.
Figure 12A:
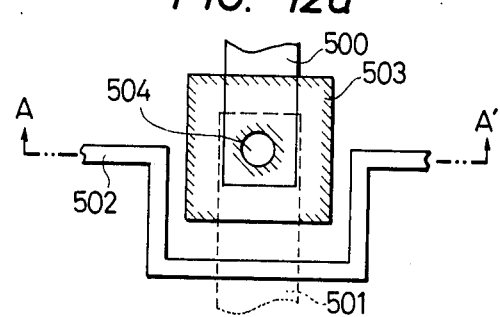
Figure 11B:
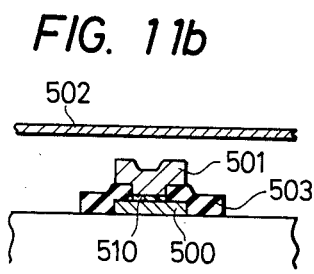
Figure 12B:
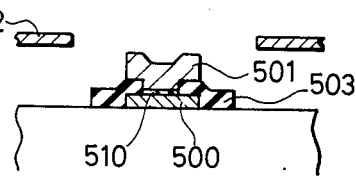

The logic arrays used in the first and second embodiments stated above are programed by bringing the individual logic cells 101 into the structure shown in FIGS. 5a and 5b or FIGS. 6a and 6b. The structures of the logic cells 101 are not restricted to those illustrated in FIGS. 5a and 5b and FIGS. 6a and 6b. As an example of a different structure, all logic cells have the same configuration in the portions of the Josephson junctions, and the coefficients of magnetic coupling with the word lines are made unequal between the logic cells to be programed and those not to be programed. As such programable logic cells, various forms can be adopted. FIGS. 11a and 11b and FIGS. 12a and 12b are examples of the alternative structure. FIG. 11a is a plan view of a programed logic cell, while FIG. 11b is a sectional view thereof taken along line A—A'. FIG. 12a is a plan view of an unprogramed logic cell, while FIG. 12b is a sectional view thereof taken along line A—A'. In the logic cell shown in FIGS. 11a and 11b, a control wiring lead 502 passes over a Josephson junction 504, and the coefficient of magnetic coupling between them is great. In contrast, in the logic cell shown in FIGS. 12a and 12b, a control wiring lead 502 is formed so as to make a detour round a Josephson junction 504, and the coefficient of magnetic coupling between them is small. The other symbols in these figures indicate the same members as in FIGS. 5a and 5b and FIGS. 6a and 6b, respectively. When the logic cells illustrated in FIGS. 11a and 11b and FIGS. 12a and 12b are employed in the logic arrays 100 and 120, the inductances and capacitances of the respective bit lines become uniform. Thus, waveforms at the time at which pulse currents are caused to flow through the bit lines are made uniform, and operations at read-out are stabilized. In addition, storage at a high density is permitted.

Figure 13:
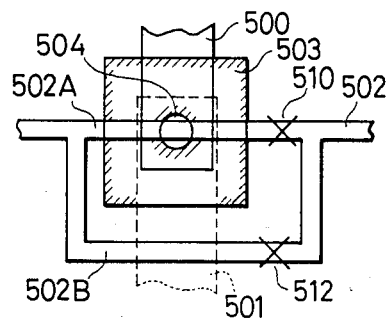
FIGS. 13 and 14 show plan views of further examples of elements in the block 101.

FIG. 13 shows still another example of the logic cell 101. In this logic cell, a control line 502 is branched into a first subline 502A which passes near a Josephson junction 504 and a second subline 502B which detours round it. This logic cell is programed in such a way that either a portion 510 or a portion 512 is blown out by irradiating it with a laser beam. A logic array employing this logic cell is demeritorious for mass-producing arrays of the same logic, but it is meritorious in case of correcting and altering logic frequently because it can be programed immediately before its assemblage into a system.

Figure 14:
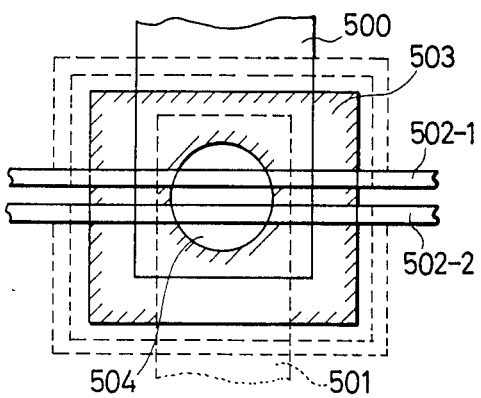

FIG. 14 shows the setup of a still another logic cell. In this logic cell, logic cells of 2 bits are comprised, and two control lines 502-1 and 502-2 are allotted to a single Josephson element. The control line of the logic cell, namely, the word line in the logic array is formed by either a path indicated by solid lines or a path indicated by broken lines, whereby the logic cell is programed.

Figure 15:
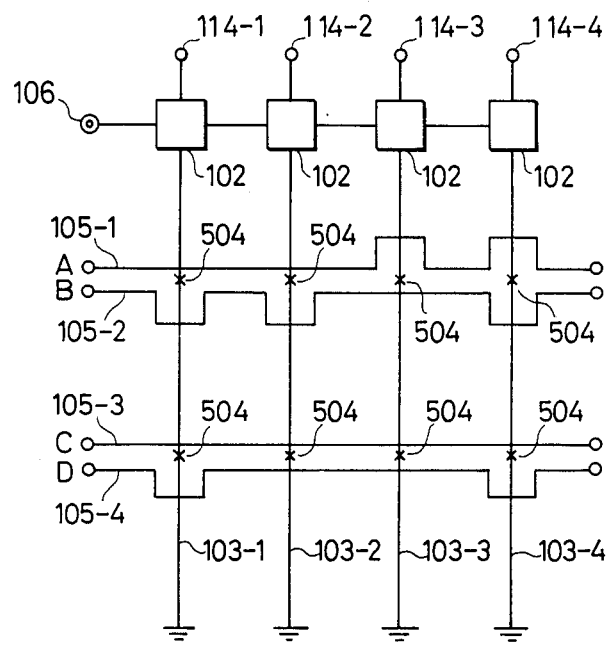
FIG. 15 is a circuit diagram of the block 101 which employs the elements in FIG. 14.

FIG. 15 shows a circuit diagram in the case where the logic cell of FIG. 14 is applied to the first logic array 100 of FIG. 1. With the illustrated example of programing, when logic signals A, B, C and D are respectively applied to word lines 105-1, 105-2, 105-3 and 105-4, output signals indicative of logic D·D and logic A·B·D are respectively provided from output terminals 114-1 and 114-4 by way of example.

Figure 16:
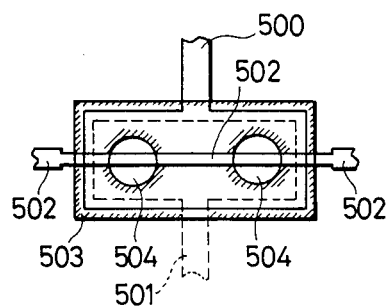
FIGS. 16 and 17 show plan views of further examples of elements in the block 101.
Figure 17:
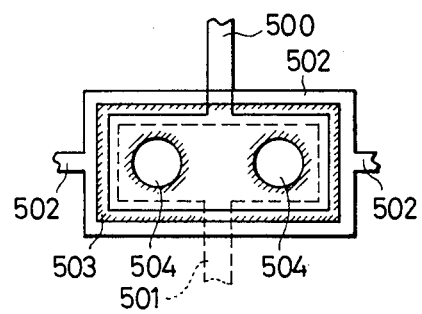
Figure 18A:
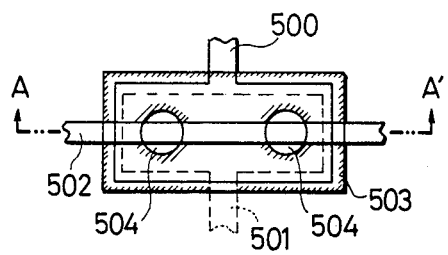
FIGS. 18a and 18b and FIGS. 19a and 19b are plan views and sectional views of further examples of elements in the block 101, respectively.
Figure 19A:
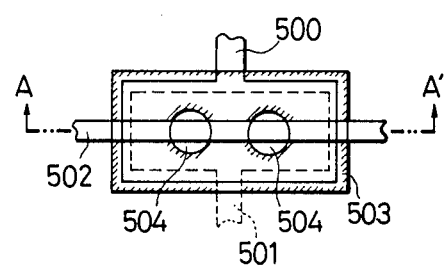
Figure 18B:
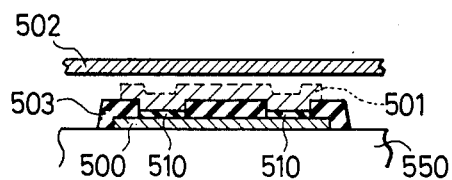
Figure 19B:
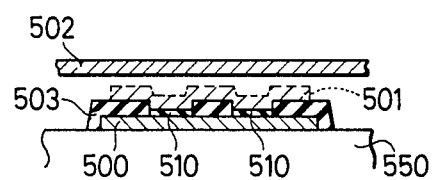

FIGS. 16 and 17 show a further example of the logic cell. In case of programing this logic cell, the width of a control line 502 is made small over a Josephson interferometer as shown in FIG. 16, and in the unprogramed logic cell, it is made large as shown in FIG. 17.

In the above modifications of the logic cells 101, the Josephson device may include a single junction or may well be a Josephson interferometer having a plurality of junctions.

FIGS. 18a and 18b and FIGS. 19a and 19b show a yet further example of the logic cell. In this example, in case of programing the logic cell, the distance between the two Josephson junctions 504 of a Josephson interferometer is made long as shown in a plan view of FIG. 18a and a sectional view of FIG. 18b, whereas in case of not, the distance between the two Josephson junctions 504 is made short as shown in a plan view of FIG. 19a and a sectional view of FIG. 19b.

Figure 20:
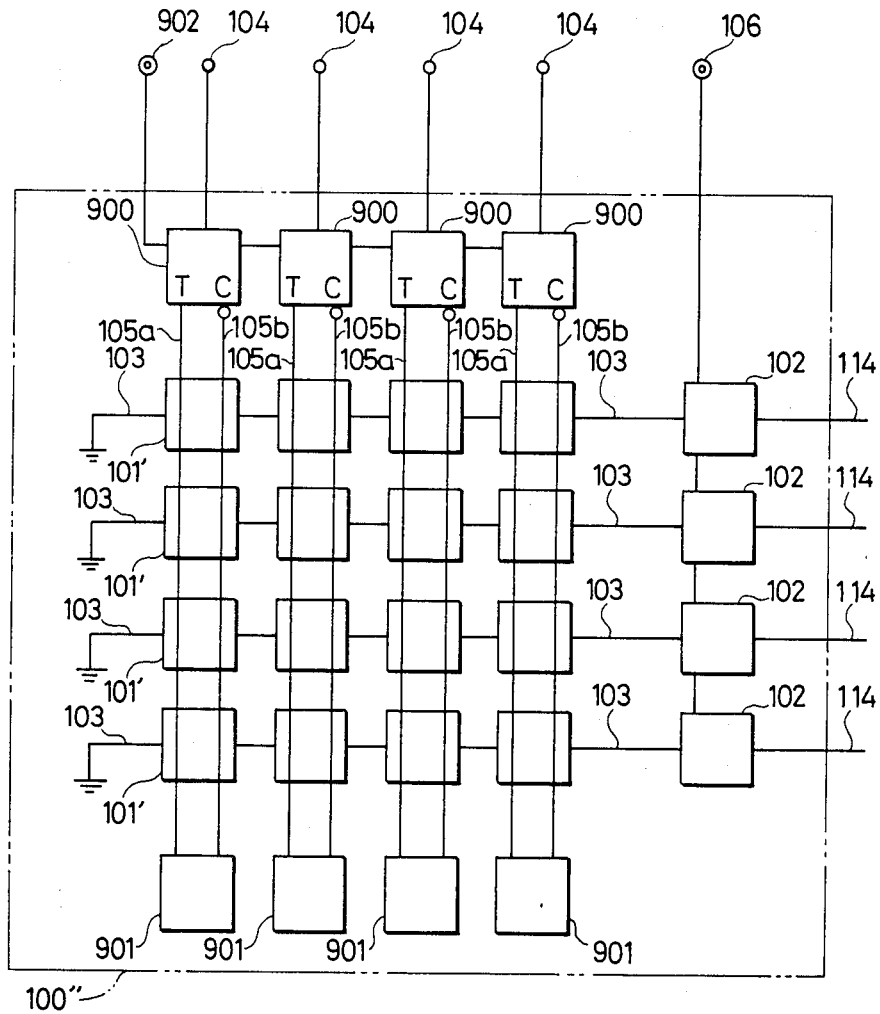
FIG. 20 is a block diagram of another embodiment of a block 100 in FIG. 1.

FIG. 20 shows a logic array 100" which is used instead of the first logic array 100 of the embodiment illustrated in FIG. 1. This logic array 100" is employed in combination with the timed inverter circuits 110 and second logic array 120 explained with reference to FIG. 1.

Figure 21:
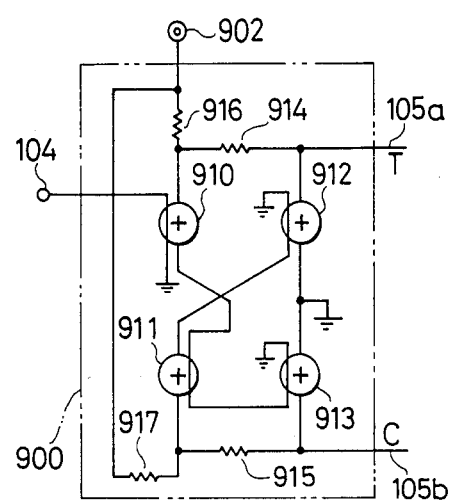
FIG. 21 is a circuit diagram of a block 900 in FIG. 20.
Figure 22:
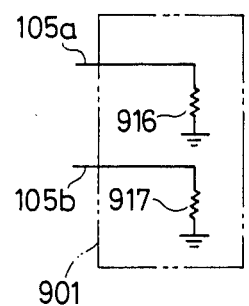
FIG. 22 is a circuit diagram of a block 901 in FIG. 20.

Referring to FIG. 20, logic cells 101' arrayed flush are connected through first bit lines 103 in the lateral direction (bit direction). The terminal end of the first bit line 103 is grounded, while the other end is connected to a first bit driver circuit 102. In the vertical direction (word direction) of the logic cells 101', two common word lines 105a and 105b are arranged. One end of each of the two word lines 105a and 105b is connected to a terminating circuit 901, while the other end is connected to a word driver circuit 900. FIG. 21 shows an example of the word driver circuit 900. The circuit shown in FIG. 21 is what is called "Self Gate AND circuit", and is described in detail in, for example, IE[3] SC-13, No. 5 (1978), pp.583–590 by A. Davidson. The circuit depicted in FIG. 21 is constructed of four magnetic coupling Josephson OR circuits 910, 911, 912 and 913, and four resistors 914, 915, 916 and 917. It has the function of supplying the word line 105a with the same signal (affirmative signal) as a signal applied to a terminal 104 and supplying the word line 105b with the inverted signal thereof, in synchronism with a timing at which a voltage is applied to a terminal 902. FIG. 22 shows an example of the terminating circuit 901. In the terminating circuit 901, the word lines 105a and 105b are grounded through resistors 916 and 917.

Figure 23:
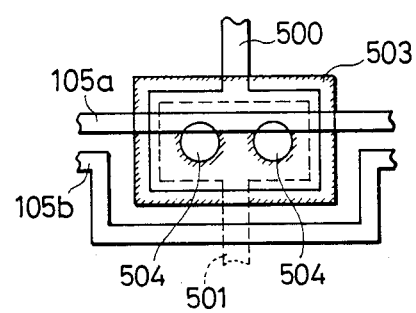
FIGS. 23, 24 and 25 are plan views of elements in a block 101' in FIG. 20.
Figure 24:
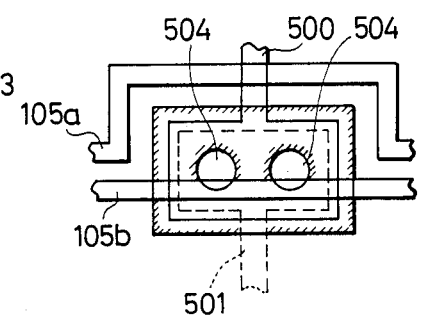
Figure 25:
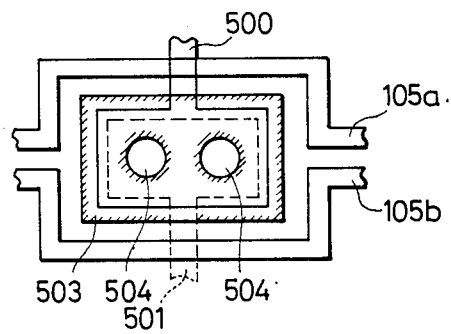

FIGS. 23, 24 and 25 show the structures of the individual logic cells 101' in the logic array 100" of FIG. 20. Among them, FIGS. 23 and 24 illustrate the structures of the logic cells in programed states, and FIG. 25 illustrates the structure of the unprogramed logic cell. In the logic cell of FIG. 23, only the word line 105a passes over the logic cell, while in the logic cell of FIG. 24, only the word line 105b passes the same. That is, the affirmative signal of the signal applied to the terminal 104 is programed in the logic cell of FIG. 23, and the negative signal in the logic cell of FIG. 24. Therefore, the logic cell of FIG. 23 becomes the non-superconducting state when current has flowed through the word line 105a, and the logic cell of FIG. 24 becomes it when current has flowed through the word line 105b. In the logic cell of FIG. 25, both the word lines 105a and 105b detour round the logic cell. Therefore, even when currents have flowed through both the word lines 105a and 105b, the logic cell remains in the superconducting state.

When the circuit which generates the affirmative and negative signals of the input signal and applies them to the respective word lines as illustrated in FIG. 20 is added to the first logic array of FIG. 1, logic outputs based on both the affirmative and negative signals of the input signal can be obtained, and hence, a programable logic array of wider applications can be realized.

The individual logic arrays 100, 100' and 120 of the foregoing embodiments fulfill the function of read-only memories which operate at high speed. In order to use such memory as a random access type read-only memory the stored contents of which are read out by appointing desired addresses, the word lines and bit lines may be furnished with decoders for decoding address signals so as to fetch the information of desired cells in the logic array.

I claim:
1. A superconducting programable logic array comprising:
(a) first bit lines arranged in parallel to one another and each including a plurality of line portions, a first terminal of each first bit line being connected to an ac voltage source having a predetermined phase and a second terminal thereof being grounded;

(b) first Josephson junctions respectively connecting two neighboring line portions of said plurality of first bit lines and respectively having predetermined programed states;

(c) first word lines arranged to cross said first bit lines and each connected to one of said Josephson junctions belonging to each of said first bit lines for controlling electric states of the Josephson junctions it is connected to in response to an applied input signal;

(d) second bit lines arranged in parallel to one another and each including a plurality of line portions, a first terminal of each second bit line being connected to an ac voltage source having said predetermined phase and a second terminal thereof being grounded;

(e) second Josephson junctions respectively connecting two neighboring line portions of said plurality of second bit lines, and respectively having predetermined programed states;

(f) second word lines each provided in correspondence to one of said first bit lines, arranged to cross said second bit lines and each connected to one of said Josephson junctions belonging to each of said second bit lines for controlling electric states of the Josephson junctions it is connected to in response to an applied control signal;

(g) a plurality of gate means connected to said first bit lines, said second word lines and an ac voltage source having said predetermined phase, said gate means including means for inverting signals from respective first bit lines and for supplying the inverted signals to second word lines which respectively correspond to said first bit lines as a control signal in response to a timing signal applied to said gate means which is out of phase with the predetermined phase; and (h) output means connected to said second bit lines for deriving signals corresponding to predetermined programable states of said second Josephson junctions from said second bit lines.

2. A superconducting programable logic array according to claim 1, wherein said first bit lines are perpendicular to said second bit lines and are parallel to said second word lines.

3. A superconducting programable logic array according to claim 1, wherein said inverted signals are ac signals.

4. A superconducting programable logic array according to claim 3, wherein said plurality of gate means each comprises a first Josephson OR circuit controlled by a signal from a corresponding one of said first bit lines and connected to an ac voltage source having said predetermined phase, a second Josephson OR circuit controlled by the applied timing signal and connected to the first Josephson OR circuit and a current injection type Josephson AND circuit connected to said second Josephson OR circuit and an ac voltage source having said predetermined phase for providing the inverted signal to said second word line.

5. A superconducting programable logic array comprising:

(a) first bit lines arranged in parallel to one another including a plurality of line portions, said first bit lines each being connected to an ac voltage source having a predetermined phase;

(b) first Josephson junctions respectively connecting two neighboring line portions of said plurality of first bit lines and respectively having predetermined programed states;

(c) first word lines arranged to cross said first bit lines and each connected to one of said Josephson junctions belonging to each of said first bit lines for controlling electric states of the Josephson junctions it is connected to in response to an applied input signal;

(d) second bit lines arranged in parallel to one another and each including a plurality of line portions, a first terminal of each second bit line being connected to an ac voltage source having said predetermined phase and a second terminal thereof being grounded;

(e) second Josephson junctions respectively connecting two neighboring line portions of said plurality of second bit lines, and respectively having predetermined programed states;

(f) second word lines each provided in correspondence to one of said first bit lines, arranged to cross said second bit lines and each connected to one of said Josephson junctions belonging to each of said second bit lines for controlling electric states of the Josephson junctions it is connected to in response to an applied control signal;

(g) a plurality of gate means connected to said first bit lines and said second word lines for supplying control signals from said first bit lines to corresponding second word lines in response to an applied timing signal which is out of phase with the predetermined phase; and (h) output means connected to said second bit lines for deriving signals corresponding to predetermined programable states of said second Josephson junctions from said second bit lines.

6. A superconducting programable logic array according to clam 5, wherein said first bit lines are perpendicular to said second bit lines and are parallel to said second word lines.

7. A superconducting programable logic array according to claim 5, wherein said supplied signals to said second word lines are ac signals.

8. A superconducting programable logic array according to claim 7, wherein said plurality of gate means each comprises a current injection type Josephson AND circuit for providing control signals to one of said second word lines in accordance with a signal supplied from a corresponding one of said first bit lines when the timing signal exceeds a predetermined threshold.

* * * * *